United States Patent
Han et al.

(10) Patent No.: US 11,342,195 B1
(45) Date of Patent: May 24, 2022

(54) METHODS FOR ANISOTROPIC ETCH OF SILICON-BASED MATERIALS WITH SELECTIVITY TO ORGANIC MATERIALS

(71) Applicant: Tokyo Electron Limited, Tokyo (JP)

(72) Inventors: Yun Han, Albany, NY (US); Peter Ventzek, Austin, TX (US); Alok Ranjan, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/167,199

(22) Filed: Feb. 4, 2021

(51) Int. Cl.
*H01L 21/3213* (2006.01)
*H01L 21/311* (2006.01)
*H01L 21/02* (2006.01)
*H01L 21/3065* (2006.01)

(52) U.S. Cl.
CPC .. *H01L 21/32137* (2013.01); *H01L 21/02118* (2013.01); *H01L 21/02274* (2013.01); *H01L 21/3065* (2013.01); *H01L 21/30655* (2013.01); *H01L 21/31116* (2013.01); *H01L 21/31138* (2013.01); *H01L 21/31144* (2013.01); *H01L 21/32136* (2013.01)

(58) Field of Classification Search
CPC ......... H01L 21/31116; H01L 21/02274; H01L 21/02118; H01L 21/31138; H01L 21/31144
See application file for complete search history.

(56) References Cited

U.S. PATENT DOCUMENTS

| | | | |
|---|---|---|---|
| 6,720,273 B1* | 4/2004 | Becker | H01J 37/32174 438/723 |
| 6,846,746 B2 | 1/2005 | Rattner et al. | |
| 8,871,105 B2 | 10/2014 | Winniczek et al. | |
| 9,029,242 B2 | 5/2015 | Holden et al. | |
| 10,535,531 B2 | 1/2020 | Rastogi et al. | |
| 2005/0153538 A1* | 7/2005 | Tsai | H01L 21/31116 438/636 |
| 2009/0272717 A1 | 11/2009 | Pamarthy et al. | |
| 2010/0308014 A1* | 12/2010 | Cheshire | H01L 21/30655 216/37 |
| 2018/0102257 A1* | 4/2018 | Nagabhirava | H01L 21/31116 |
| 2018/0130669 A1 | 5/2018 | Lane et al. | |

* cited by examiner

*Primary Examiner* — Jiong-Ping Lu
(74) *Attorney, Agent, or Firm* — Slater Matsil, LLP

(57) ABSTRACT

Improved process flows and methods are provided that use a cyclic dry process to transfer a pattern from a patterned organic layer to an underlying silicon-containing layer. The cyclic dry process disclosed herein includes a deposition step, an etch step and a purge step, which may be repeated a number of cycles to progressively etch the exposed portions of the silicon-containing layer. Unlike conventional pattern transfer processes, the cyclic dry process described herein anisotropically etches the silicon-containing layer with high selectivity to the patterned organic layer. In doing so, the disclosed process improves pattern transfer performance and avoids problems typically seen in conventional pattern transfer processes such as, e.g., CD enlargement, CD distortion and/or complete loss of photoresist.

20 Claims, 7 Drawing Sheets

METHODS FOR ANISOTROPIC ETCH OF SILICON-BASED MATERIALS WITH SELECTIVITY TO ORGANIC MATERIALS

BACKGROUND

The present disclosure relates to the processing of substrates. In particular, it provides a novel method and process flow for transferring patterns to silicon-based materials underlying a patterned organic layer.

As geometries in substrate processing continue to shrink, the technical challenges to forming structures on substrates via photolithography techniques increase. As requirements for smaller geometry structures arose, a variety of photolithography techniques have been utilized for achieving suitable photolithography for such structures, including extreme ultraviolet (EUV) lithography, multiple patterning schemes (including direct self-aligned (DSA) multiple patterning, self-aligned multiple patterning (SAMP) schemes such as, for example, self-aligned double patterning (SADP), self-aligned quadruple patterning (SAQP), self-aligned octuple patterning (SAOP), etc.), argon fluoride (ArF) lithography, or other small geometry patterning methods. Although reduced feature sizes are achieved, pattern performance problems have occurred in some conventional small geometry patterning methods.

For example, photolithography techniques have been used to transfer patterns from organic materials (such as photoresist) to underlying silicon-based materials (such as silicon oxides, silicon nitrides, etc.). In conventional pattern transfer processes, a patterned substrate comprising a patterned organic layer formed over a silicon-containing layer may be exposed to light during a lithography step, and a wet or dry process may be performed after the lithography step to remove the exposed portions of the silicon-containing layer and develop the pattern. When a dry process is used in conventional pattern transfer processes, poor selectivity between the organic layer and the silicon-containing layer may cause various pattern performance problems, such as critical dimension (CD) enlargement, CD distortion and/or complete loss of photoresist.

FIGS. 1A-1B illustrate a conventional pattern transfer process that utilizes a dry process for developing a pattern in a silicon-containing layer underlying a patterned organic layer. In the embodiment shown in FIG. 1A, a patterned substrate 100 includes a patterned organic layer 110 formed over a silicon-containing layer 108, which in turn, is formed over one or more underlying layers, such as a hard mask layer 106, organic layer 104 and base substrate layer 102. The base substrate 102, hard mask layer 106 and organic layer 104 may be formed from any of a wide variety of materials, as is known in the art. The patterned organic layer 110 and the silicon-containing layer 108 may utilize a wide variety of organic and silicon-based materials, respectively. For example, the patterned organic layer 110 may be a photoresist, organic dielectric layer (ODL), organic planarization layer (OPL), spin on carbon (SOC) layer, amorphous carbon layer (ACL), etc. Likewise, the silicon-containing layer 108 may be a silicon layer, silicon oxide layer, a silicon oxynitride layer, a silicon nitride layer, a silicon on glass (SOG) layer or a silicon anti-reflective coating (ARC) layer, etc.

After a lithography process is performed to expose uncovered portions of the silicon-containing layer 108, a dry process comprising a single plasma may be used to remove the exposed portions of the silicon-containing layer 108 and develop the pattern. As shown in FIG. 1B, for example, the patterned substrate 100 may be exposed to a plasma 112 to etch or remove the exposed portions of the silicon-containing layer 108. Unfortunately, poor etch selectivity between the patterned organic layer 110 and the silicon-containing layer 108 may cause the patterned organic layer 110 to be etched along with the silicon-containing layer 108. This leads to pattern performance problems, such as CD enlargement, CD distortion and/or complete loss of photoresist.

As such, a need exists for an improved process and method for transferring a pattern to a silicon-containing layer underlying a patterned organic layer.

SUMMARY

Improved process flows and methods are provided herein for transferring a pattern from a patterned organic layer to a silicon-containing layer underlying the patterned organic layer. More specifically, improved process flows and methods are provided herein that utilize a cyclic dry process to transfer a pattern from a patterned organic layer to an underlying silicon-containing layer. The process flows and methods disclosed herein may utilize a wide variety of organic and silicon-containing materials. Example organic materials that may be utilized herein include, but are not limited to, materials commonly used as a photoresist, organic dielectric layer (ODL), organic planarization layer (OPL), spin on carbon (SOC) layer, amorphous carbon layer (ACL), etc. Example silicon-containing materials that may be utilized herein include, but are not limited to, silicon, silicon oxides, silicon oxynitrides, silicon nitrides, silicon on glass (SOG), silicon anti-reflective coating (ARC), etc. materials. Other organic and silicon-containing materials may also be used.

Unlike conventional pattern transfer processes, a cyclic dry process containing multiple plasma processing steps is used herein to remove exposed portions of the silicon-containing layer and transfer a pattern from the patterned organic layer to the underlying silicon-containing layer. The cyclic dry process disclosed herein may generally include a deposition step, an etch step and a purge step, which may be repeated a number of cycles to progressively etch the exposed portions of the silicon-containing layer. Unlike conventional pattern transfer processes, the cyclic dry process described herein anisotropically etches the silicon-containing layer with high selectivity to the patterned organic layer. In doing so, the disclosed process improves pattern transfer performance and avoids problems typically seen in conventional pattern transfer processes such as, e.g., CD enlargement, CD distortion and/or complete loss of photoresist.

In one embodiment, a method for patterning a substrate is provided. The method may comprise forming one or more underlying layers on the substrate, wherein the one or more underlying layers comprise a silicon-containing layer, forming a patterned organic layer over the silicon-containing layer; and performing a cyclic dry process to remove exposed portions of the silicon-containing layer not covered by the patterned organic layer and transfer a pattern from the patterned organic layer to the silicon-containing layer, wherein the cyclic dry process includes a deposition step and an etch step, the etch step utilizing a pulsed plasma. The method further comprises repeating the cyclic dry process.

In one embodiment, the cyclic dry process comprises (1) as part of the deposition step, depositing a polymer layer onto a surface of the substrate by exposing the substrate to a first plasma while the substrate is disposed within a processing chamber; (2) as part of the etch step, etching the polymer layer and the exposed portions of the silicon-containing layer by exposing the substrate to a second plasma while the substrate is disposed within the processing chamber, wherein the second plasma utilizes the pulsed plasma; (3) as part of a purge step, purging the processing chamber to remove byproducts of said etching from the processing chamber; and (4) repeating the deposition, etch and purge steps a number of cycles and/or until the exposed portions of the silicon-containing layer are completely removed.

In some embodiments of the methods, the first plasma comprises a polymerizing gas chemistry. In some embodiments of the methods, the first plasma gas chemistry comprises a hydrocarbon, fluorocarbon and/or $CH_xF_y$ gas chemistry. In some embodiments of the methods, the deposition step is performed using process conditions which generate a radical-rich first plasma, which provides deposition of the polymer layer onto top and sidewalls surfaces of the patterned organic layer. In some embodiments, the deposition of the polymer layer reduces or prevents lateral damage to the patterned organic layer and the silicon-containing layer during the etch step. In some embodiments, the second plasma comprises an ultra-lean gas chemistry. In some embodiments, the second plasma gas chemistry comprises $NF_3$, $CF_4$ and/or $SF_6$. In some embodiments, the etch step is performed using pulsed bias power to form the pulsed plasma. In some embodiments, a short pulse of low bias power is used near the end of the etch step to control ion energy of ions in the second plasma and provide anisotropic etching of the exposed portions of the silicon-containing layer. In other embodiments, the purge step is performed by supplying an inert gas to the processing chamber at high chamber pressure to provide rapid removal of etch byproducts. In other embodiments, the processing chamber is not purged between the deposition step and the etch step.

In another embodiment, a method for patterning a substrate is provided. The method may comprise forming one or more underlying layers on the substrate, wherein the one or more underlying layers comprise a silicon-containing layer and forming a patterned organic layer over the silicon-containing layer. The method further comprises depositing a polymer layer onto a surface of the substrate by exposing the substrate to a first plasma while the substrate is disposed within a processing chamber. The method also comprises etching the polymer layer and exposed portions of the silicon-containing layer not covered by the patterned organic layer by exposing the substrate to a second plasma while the substrate is disposed within the processing chamber, wherein the second plasma includes the use of a pulsed bias power. The method also comprises purging the processing chamber to remove byproducts of said etching from the processing chamber; and repeating the depositing, etching and purging steps a number of cycles and/or until the exposed portions of the silicon-containing layer are completely removed.

In some embodiments of the methods, the pulsed bias power has a duty cycle of 20% or less. In some embodiments, the pulsed bias power is used near the end of the etching step to control ion energy of ions in the second plasma and provide anisotropic etching of the exposed portions of the silicon-containing layer.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Improved process flows and methods are provided herein for transferring a pattern from a patterned organic layer to a silicon-containing layer underlying the patterned organic layer. More specifically, improved process flows and methods are provided herein that utilize a cyclic dry process to transfer a pattern from a patterned organic layer to an underlying silicon-containing layer. The process flows and methods disclosed herein may utilize a wide variety of organic and silicon-containing materials. Example organic materials that may be utilized herein include, but are not limited to, materials commonly used as a photoresist, organic dielectric layer (ODL), organic planarization layer (OPL), spin on carbon (SOC) layer, amorphous carbon layer (ACL), etc. Example silicon-containing materials that may be utilized herein include, but are not limited to, silicon, silicon oxides, silicon oxynitrides, silicon nitrides, silicon on glass (SOG), silicon anti-reflective coating (ARC), etc. materials. Other organic and silicon-containing materials may also be used.

Unlike conventional pattern transfer processes, a cyclic dry process containing multiple plasma processing steps is used herein to remove exposed portions of the silicon-containing layer and transfer a pattern from the patterned organic layer to the underlying silicon-containing layer. The cyclic dry process disclosed herein may generally include a deposition step, an etch step and a purge step, which may be repeated a number of cycles to progressively etch the exposed portions of the silicon-containing layer. Unlike conventional pattern transfer processes, the cyclic dry process described herein anisotropically etches the silicon-containing layer with high selectivity to the patterned organic layer. In doing so, the disclosed process improves pattern transfer performance and avoids problems typically seen in conventional pattern transfer processes such as, e.g., CD enlargement, CD distortion and/or complete loss of photoresist.

FIGS. 2A-2E illustrate one embodiment of an improved process flow for transferring a pattern, which is formed within an organic layer, to an underlying silicon-containing layer according to the techniques disclosed herein. It will be recognized that the embodiment shown in FIGS. 2A-2E is merely exemplary and the techniques described herein may be applied to other process flows.

Figure 1A:
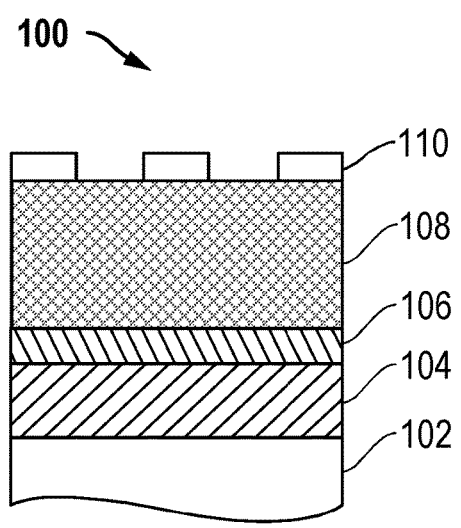
FIG. 1A-1B illustrate a conventional pattern transfer process wherein a dry process is used to transfer a pattern from a patterned organic layer to an underlying silicon-containing layer.
Figure 1B:
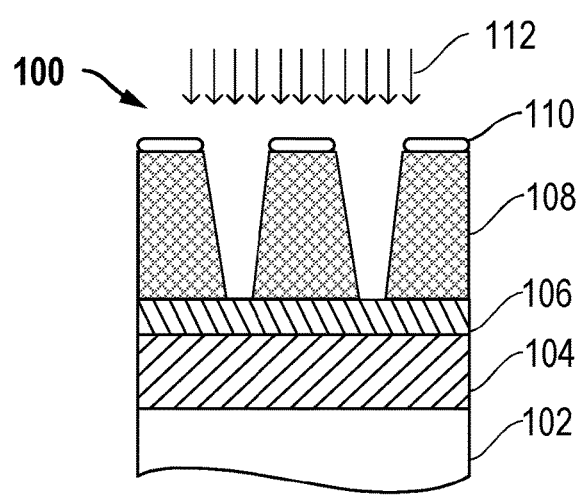
Figure 2A:
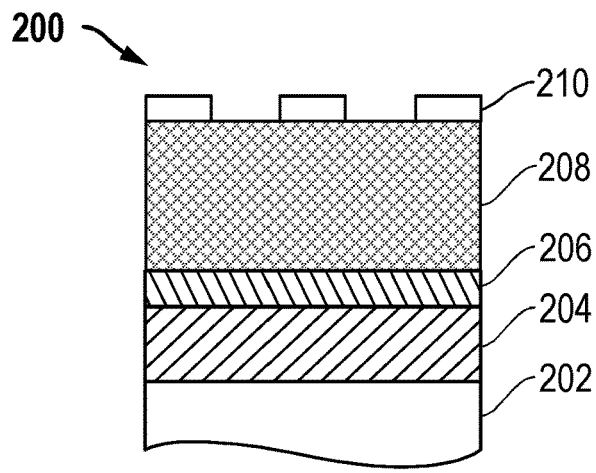
FIGS. 2A-2E illustrate an improved pattern transfer process in which a cyclic dry process containing multiple plasma processing steps is used to transfer a pattern from a patterned organic layer to an underlying silicon-containing layer.

As shown in FIG. 2A, patterned substrate 200 includes a patterned organic layer 210 formed over a silicon-containing layer 208, which in turn, is formed over one or more underlying layers, such as but not limited to, hard mask layer 206, organic layer 204 and base substrate layer 202. Base substrate 202 may be any substrate for which the use of patterned features is desirable. For example, base substrate 202 may be a semiconductor substrate having one or more semiconductor processing layers formed thereon. In one embodiment, base substrate 202 may be a substrate that has been subject to multiple semiconductor processing steps which yield a wide variety of structures and layers, all of which are known in the substrate processing art.

The hard mask layer 206 and organic layer 204 shown in FIG. 2A may be formed from any of a wide variety of materials, as is known in the art. In one embodiment, the hard mask layer 206 may be a spin on glass (SOG) layer and the organic layer 204 may be a spin on carbon (SOC) layer. It is recognized, however, that the underlying layers described and shown in the figures are merely exemplary, and more, less or other underlying layers may be utilized.

The silicon-containing layer 208 shown in FIG. 2A may be formed from any of a wide variety of materials commonly used in lithography. In some embodiments, the silicon-containing layer 208 may comprise a silicon-based material. For example, the silicon-containing layer 208 may comprise a silicon, silicon oxide, silicon oxynitride, silicon nitride, a silicon on glass (SOG), silicon anti-reflective coating (ARC), etc. material. Other silicon-based materials may also be used to implement the silicon-containing layer 208. The silicon-containing layer 208 may generally be formed using any of a wide variety of formation processes as is well known in the art, such as but not limited to, chemical vapor deposition, plasma deposition, spin-on processes, atomic layer deposition, etc.

After the silicon-containing layer 208 is formed, an organic layer 210 is formed on the silicon-containing layer 208 and the organic layer 210 is patterned by a lithography process. The patterned organic layer 210 shown in FIG. 2A may be formed from any of a wide variety of materials commonly used in lithography. In some embodiments, the patterned organic layer 210 may comprise an organic material. For example, the patterned organic layer 210 may comprise a photoresist, organic dielectric layer (ODL), organic planarization layer (OPL), spin on carbon (SOC) layer, amorphous carbon layer (ACL), etc. Other organic materials may also be used to implement the patterned organic layer 210. The patterned organic layer 210 may generally be formed using any of a wide variety of deposition processes as is well known in the art, such as but not limited to, chemical vapor deposition, plasma deposition, spin-on processes, atomic layer deposition, etc.

Figure 2B:
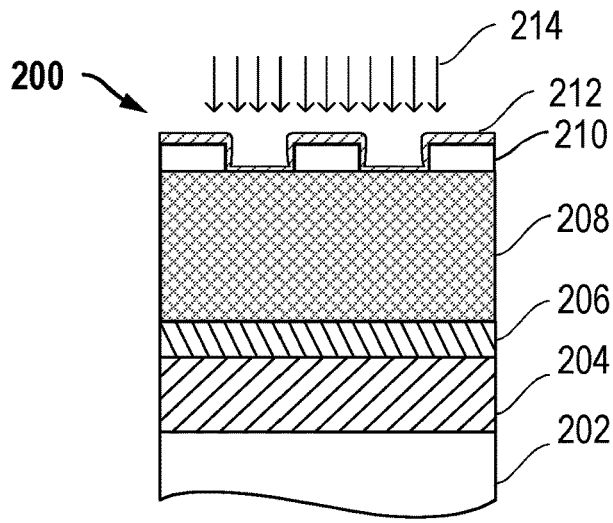
Figure 2C:
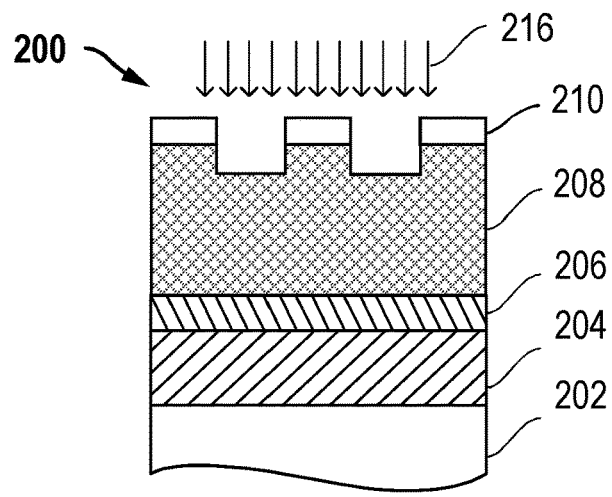
Figure 2D:
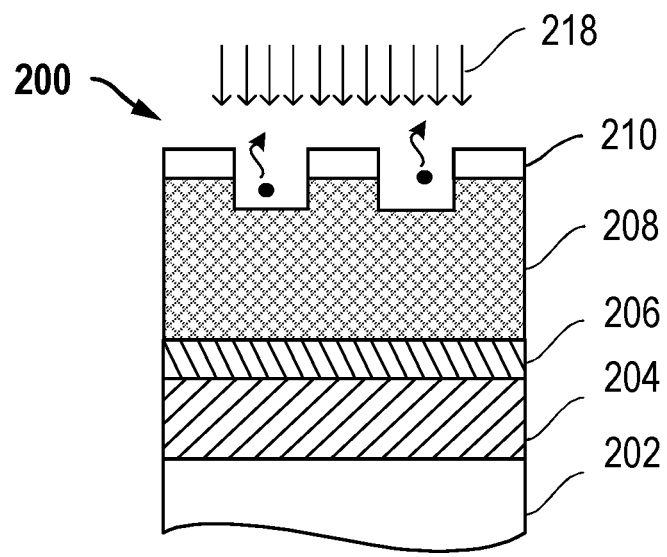
Figure 2E:
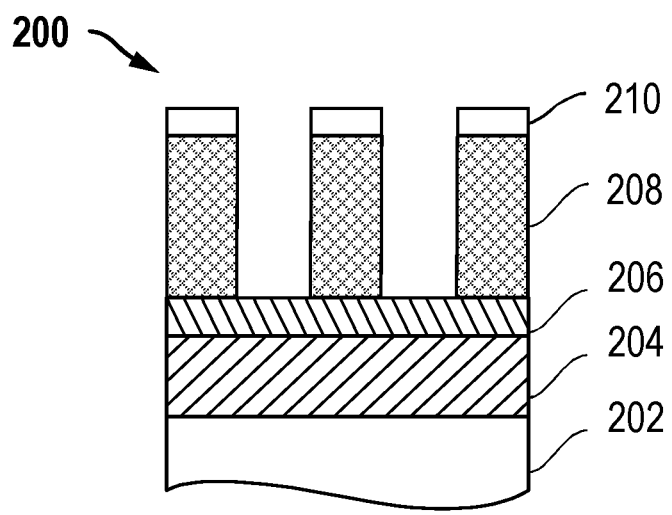

After a lithography process is performed, a cyclic dry process containing multiple plasma processing steps is used to remove the exposed portions of the silicon-containing layer 208 (i.e., portions of the silicon-containing layer 208 not protected by the patterned organic layer 210) and transfer the pattern, as shown in FIGS. 2B-2E. As shown in FIG. 2E, the cyclic dry process described herein anisotropically etches the exposed portions of the silicon-containing layer 208 with high selectivity to the patterned organic layer 210. In doing so, the disclosed process improves pattern transfer performance and avoids problems typically seen in conventional pattern transfer processes such as, e.g., CD enlargement, CD distortion and/or complete loss of photoresist.

FIGS. 2B-2E illustrate one embodiment of a cyclic dry process that may be used to transfer a pattern from an organic layer 210 to an underlying silicon-containing layer 208 in accordance with the techniques described herein. As described in more detail below, the cyclic dry process may generally include multiple plasma processing steps, such as a deposition step, etch step and purge step, which may be repeated in a cyclical manner. In some embodiments of the disclosed process, pulsed plasmas may be used to segregate the deposition and etch steps within the processing chamber. After each etch step, a purge step may be performed to remove etch byproducts from the processing chamber. The deposition, etch and purge steps may then be repeated a number of cycles to remove the exposed portions of the silicon-containing layer 208.

In some embodiments, a polymerizing gas chemistry may be used in the deposition step to deposit a polymer layer on top and sidewall surfaces of the patterned substrate 200. The polymer layer deposited during the deposition step functions to reduce or prevent lateral damage to the patterned organic layer 210 and the silicon-containing layer 208 during the subsequently performed etch step. In some embodiments, the etch step may use an ultra-lean gas chemistry to etch the exposed portions of the silicon-containing layer 208 vertically with minimal impact to the patterned organic layer 210. The example ultra-lean chemistry here refers to exemplary chemistries such as $NF_3$, $CF_4$ or $SF_6$, which exhibit no or very little deposition behavior compared to other perfluorocarbons (such as $C_2F_6$, $C_3F_8$, $C_4F_6$, $C_4F_8$) or hydrofluorocarbons (such as $CHF_3$, $CH_3F$, and $CH_2F_2$) when used in plasma etching processes. In addition to an ultra-lean etch chemistry, other plasma parameters may be controlled during the etch step to provide anisotropic etching of the silicon-containing layer 208.

Turning now to FIG. 2B, the patterned substrate 200 may be exposed to a first plasma 214 to deposit a polymer layer 212 onto a surface of the patterned substrate 200. Various plasma chemistries may be used in the deposition step shown in FIG. 2B. In some embodiments, for example, the first plasma 214 may utilize a polymerizing gas chemistry to deposit polymer layer 212 onto the substrate surface. Examples of polymerizing gas chemistries that may be used during the deposition step to generate the first plasma 214 include hydrocarbon, fluorocarbon and other $CH_xF_y$ chemistries, such as, but not limited to, $CH_4$, $C_4F_8$, $C_4F_6$ and $CH_3F$. Other polymerizing gas chemistries not specifically mentioned herein may also be used in the deposition step.

In addition to a polymerizing gas chemistry, the deposition step shown in FIG. 2B may be performed, for example, in a capacitively coupled plasma (CCP), inductively coupled plasma (ICP), or electron cyclotron resonance (ECR) plasma at high source power (e.g., 100 to 1000 W) and high chamber pressure (e.g., 50-200 mT) while using zero to very low bias power (e.g., 0 to 100 W) to generate a radical-rich first plasma 214, which allows deposition of the polymer layer 212 preferably on the top and sidewall surfaces of the patterned organic layer 210 and minimal deposition on exposed portions of the silicon-containing layer 208. In doing so, the deposition step shown in FIG. 2B reduces or prevents lateral damage to the patterned organic layer 210 and the silicon-containing layer 208 during the subsequently performed etch step.

After the polymer layer 212 is deposited in FIG. 2B, the patterned substrate 200 is exposed to a second plasma 216 to remove or etch the polymer layer 212 and the exposed portions of the silicon-containing layer 208 (i.e., the portions of the silicon-containing layer 208 not protected by the patterned organic layer 210), as shown in FIG. 2C. Various plasma chemistries may be used in the etch step shown in FIG. 2C. In some embodiments, for example, the second plasma 216 may utilize an ultra-lean etch chemistry to etch the polymer layer 212 and the exposed portions of the silicon-containing layer 208. Examples of ultra-lean etch chemistries that may be used during the etch step to generate the second plasma 216 include, but are not limited to, chemistries having $NF_3$, $CF_4$ and/or $SF_6$. Other ultra-lean etch chemistries may also be used in the etch step.

In addition to an ultra-lean etch chemistry, the etch step shown in FIG. 2C may be performed with zero to low source power (e.g., 0 to 200 W) and low chamber pressure (e.g., 10-50 mT) using a pulsed low bias power (e.g., 10 to 100 W) having a duty cycle of 2% to 20% to provide precise etch depth control on the top, bottom and sidewalls of the patterned substrate 200. This enables the etch step shown in FIG. 2C to provide anisotropic etching of the silicon-containing layer 208 by progressively etching the bottom of the silicon-containing layer 208, while minimizing or avoiding etching of the top and sidewalls of the patterned substrate 200.

As noted above, pulsed plasmas may be used in some embodiments of the disclosed process to segregate the deposition and etch steps shown in FIGS. 2B and 2C. As described in more detail below, the deposition and etch steps may be segregated by controlling one or more plasma parameters, such as but not limited to radical/ion flux ratio, ion energy and plasma species. By utilizing pulsed plasma technology, radical/ion flux, and flux ratio, ion energy can be precisely tuned which allows deposition/etch on the features with a very delicate control at atomic level. As a result, pulsed plasma breaks process tradeoffs between etch rate, selectivity and profile control, while in continuous wave (CW) plasma process such tradeoff is inherent.

After the etch step shown in FIG. 2C, a purge gas 218 is supplied to purge the processing chamber of etch byproducts, as shown in FIG. 2D. Various gases and/or gas chemistries may be used in the purge step shown in FIG. 2D. In some embodiments, for example, the purge gas 218 may comprise argon (Ar), nitrogen ($N_2$), another inert gas and/or a combination thereof. In some embodiments, the purge step shown in FIG. 2D may be performed at high chamber pressure (e.g., 200 to 800 mT) to provide rapid removal of the etch byproducts.

In the process disclosed herein, the deposition, etch and purge steps shown in FIGS. 2B-2D are repeated in a cyclical manner. In some embodiments, the deposition, etch and purge steps shown in FIGS. 2B-2D may be repeated a predetermined number of cycles. In other embodiments, the deposition, etch and purge steps shown in FIGS. 2B-2D may be repeated until the exposed portions of the silicon-containing layer 208 are completely removed, as shown in FIG. 2E. By repeating the steps shown in FIGS. 2B-2D, the process described herein provides a progressive, anisotropic etch of the silicon-containing layer 208 with high selectivity to the patterned organic layer 210 that results in a vertical sidewall profile, as shown in FIG. 2E.

Figure 3:
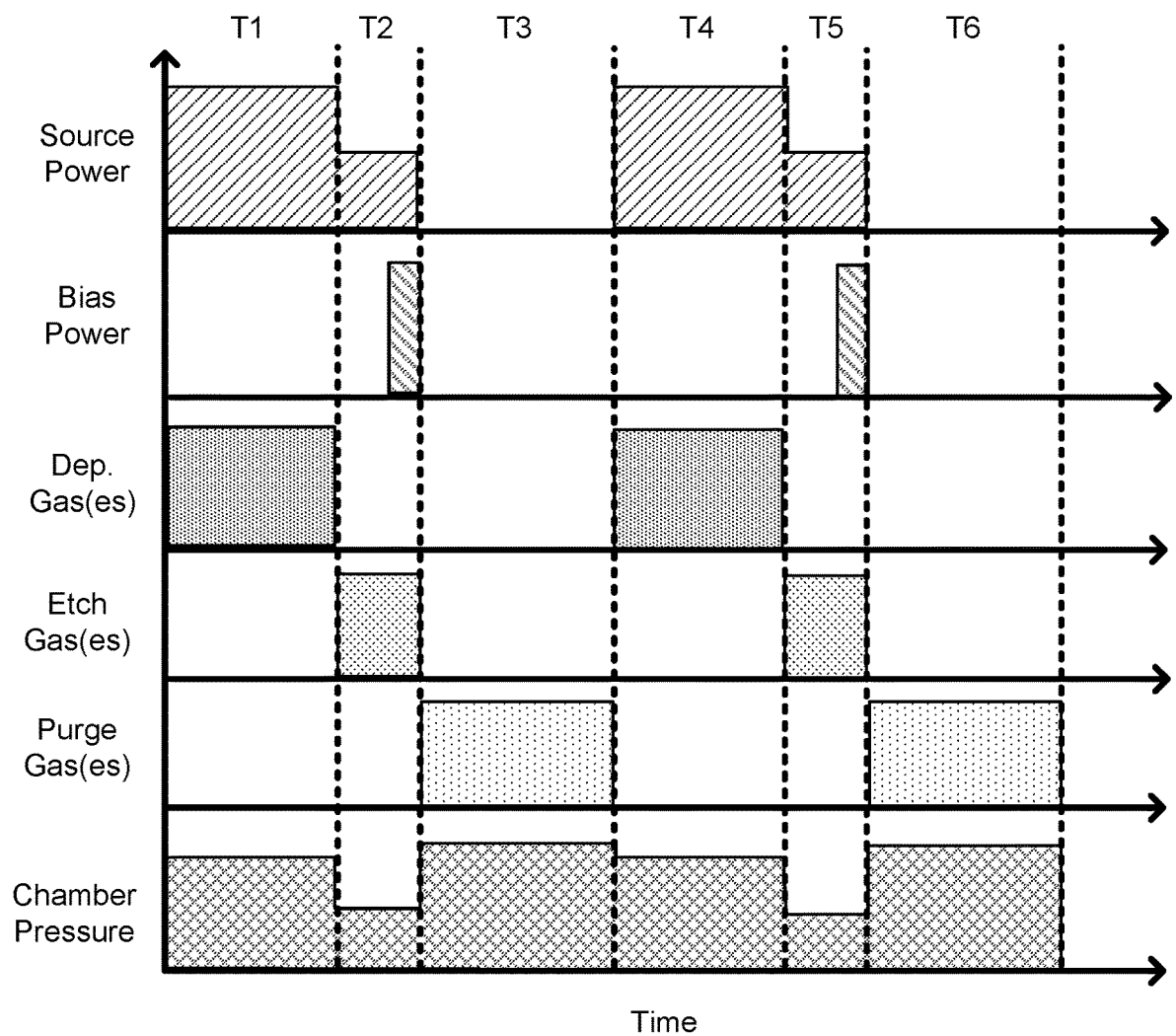
FIG. 3 illustrates example plasma process conditions that may be used to implement the cyclic dry process described herein.

FIG. 3 provides example plasma processing conditions that may be used to perform the cyclic dry process shown in FIGS. 2B-2E. As shown in FIG. 3, the source power, bias power, chamber pressure and plasma chemistries may be controlled or adjusted over time to perform the cyclic dry process shown and described herein. For example, the deposition step shown in FIG. 2B may be performed by supplying a polymerizing gas chemistry (e.g., $CH_xF_y$) to the processing chamber along with source power to generate the first plasma 214 during a first time period (T1). As shown in FIG. 3, the deposition step may be performed in some embodiments with high source power (e.g., 200 to 1000 W) and high chamber pressure (e.g., 100 to 800 mT), but zero to low bias power (e.g., 0 50 W), to generate a radical-rich first plasma 214 that enables deposition of the polymer layer 212 onto the substrate surface.

The etch step shown in FIG. 2C may be performed by supplying an ultra-lean etch chemistry (e.g., $NF_3$, $CF_4$ and/or $SF_6$) to the processing chamber along with source power to generate the second plasma 216 during a second time period (T2). As shown in FIG. 3, the etch step may be performed in some embodiments with low source power (e.g., 0 to 100 W) and low chamber pressure (e.g., 10-50 mT). Near the end of the etch step, a short pulse (e.g., 0.1 to 1 µsec) of relatively low bias power (e.g., 0 to 50 W) is used to control the ion energy of the $NF_x$ or $CF_x$ ions in the second plasma 216 and provide anisotropic etching of the silicon-containing layer 208. Pulsing the bias power near the end of the etch step enables the deposition and etch chemistries to be switched within the processing chamber without purging the processing chamber between T1 and T2.

After the etch step is performed, the purge step shown in FIG. 2D may be performed by supplying an inert gas (e.g., Ar, N or another inert gas) to the processing chamber during a third time period (T3). In some embodiments, the purge step may be performed at high chamber pressure (e.g., 200 to 800 mT) to provide rapid removal of the etch byproducts, as shown in FIG. 3. Once the processing chamber is purged, the process conditions used to perform the deposition, etch and purge steps may be repeated a number of cycles. Although two cycles (T1-T3 and T4-T6) are shown in FIG. 3, it is recognized that the process conditions used to perform the deposition, etch and purge steps may generally be repeated a predetermined number of cycles and/or until the exposed portions of an etch target layer (e.g., silicon-containing layer 208) are completely removed.

Figure 4:
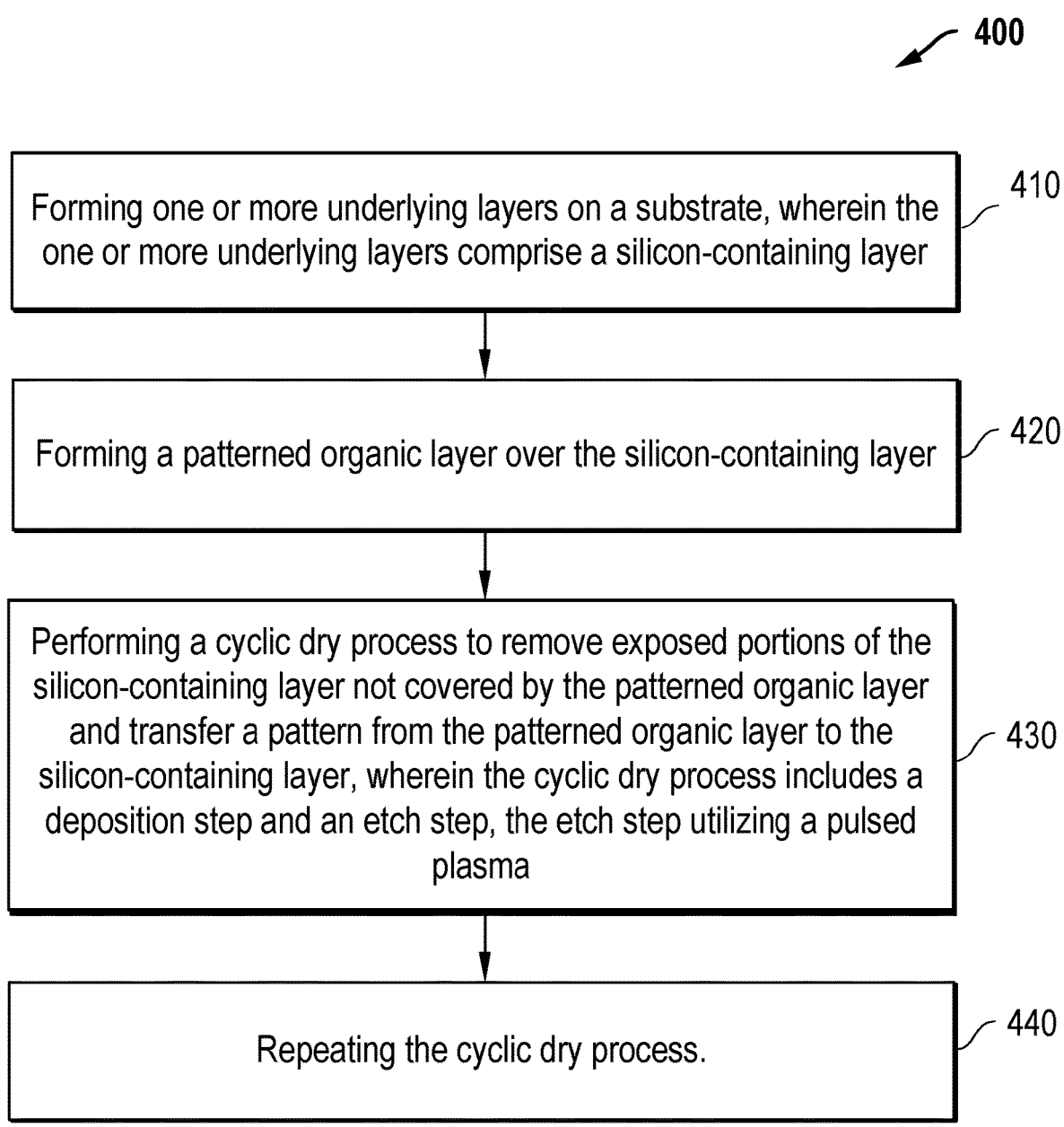
FIG. 4 is a flowchart diagram illustrating one embodiment of a method to pattern a substrate in accordance with the techniques described herein.
Figure 5:
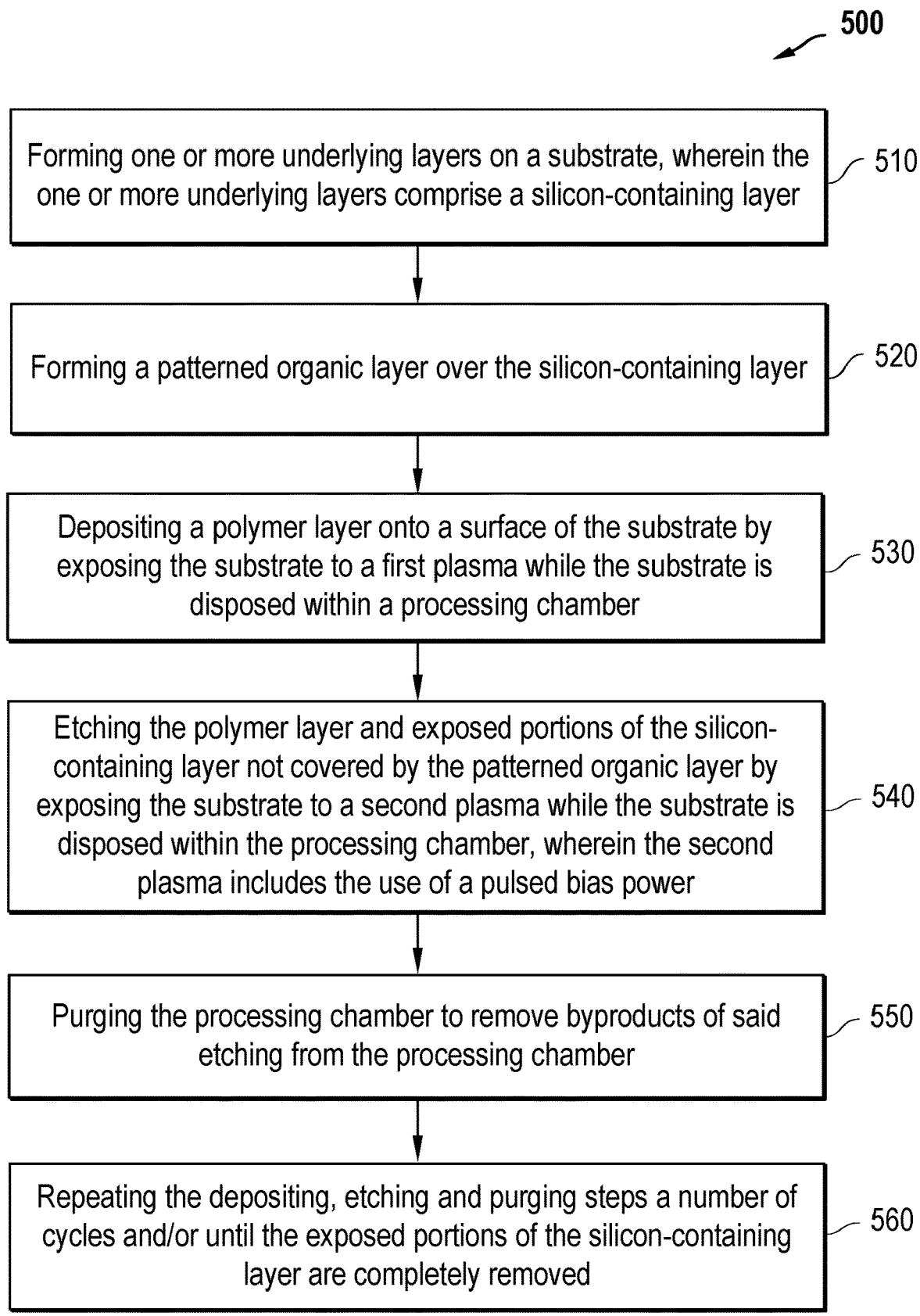
FIG. 5 is a flowchart diagram illustrating another embodiment of a method to pattern a substrate in accordance with the techniques described herein.

FIGS. 4-5 illustrate exemplary methods for use of the processing techniques described herein. It will be recognized that the embodiments of FIGS. 4-5 are merely exemplary and additional methods may utilize the techniques described herein. Further, additional processing steps may be added to the methods shown in the FIGS. 4-5 as the steps described are not intended to be exclusive. Moreover, the order of the steps is not limited to the order shown in the figures as different orders may occur and/or various steps may be performed in combination or at the same time.

FIG. 4 illustrates one embodiment of a method 400 that may be used to pattern a substrate using the techniques disclosed herein. In some embodiments, the method 400 may generally include forming one or more underlying layers on the substrate, wherein the one or more underlying layers comprise a silicon-containing layer (in step 410), forming a patterned organic layer over the silicon-containing layer (in step 420), and performing a cyclic dry process to remove the exposed portions of the silicon-containing layer not covered by the patterned organic layer and transfer a pattern from the patterned organic layer to the silicon-containing layer (in step 430). As disclosed herein, the cyclic dry process may generally include a deposition step and an etch step, and the etch step may utilize a pulsed plasma. Further, the method 400 may include repeating the cyclic dry process (in step 430).

FIG. 5 illustrates another embodiment of a method 500 that may be used to pattern a substrate using the techniques disclosed herein. In some embodiments, the method 500 may generally include forming one or more underlying layers on the substrate, wherein the one or more underlying layers comprise a silicon-containing layer (in step 510), and forming a patterned organic layer over the silicon-containing layer (in step 520). The method 500 may further include depositing a polymer layer onto a surface of the substrate by exposing the substrate to a first plasma while the substrate is disposed within a processing chamber (in step 530), etching the polymer layer and exposed portions of the silicon-containing layer not covered by the patterned organic layer by exposing the substrate to a second plasma while the substrate is disposed within the processing chamber (in step 540), and purging the processing chamber to remove byproducts of said etching from the processing chamber (in step 550). The second plasma may include the use of a pulsed bias power, as noted above. Further, the method 500 may include repeating the depositing, etching and purging steps a number of cycles and/or until the exposed portions of the silicon-containing layer are completely removed (in step 560).

Figure 6:
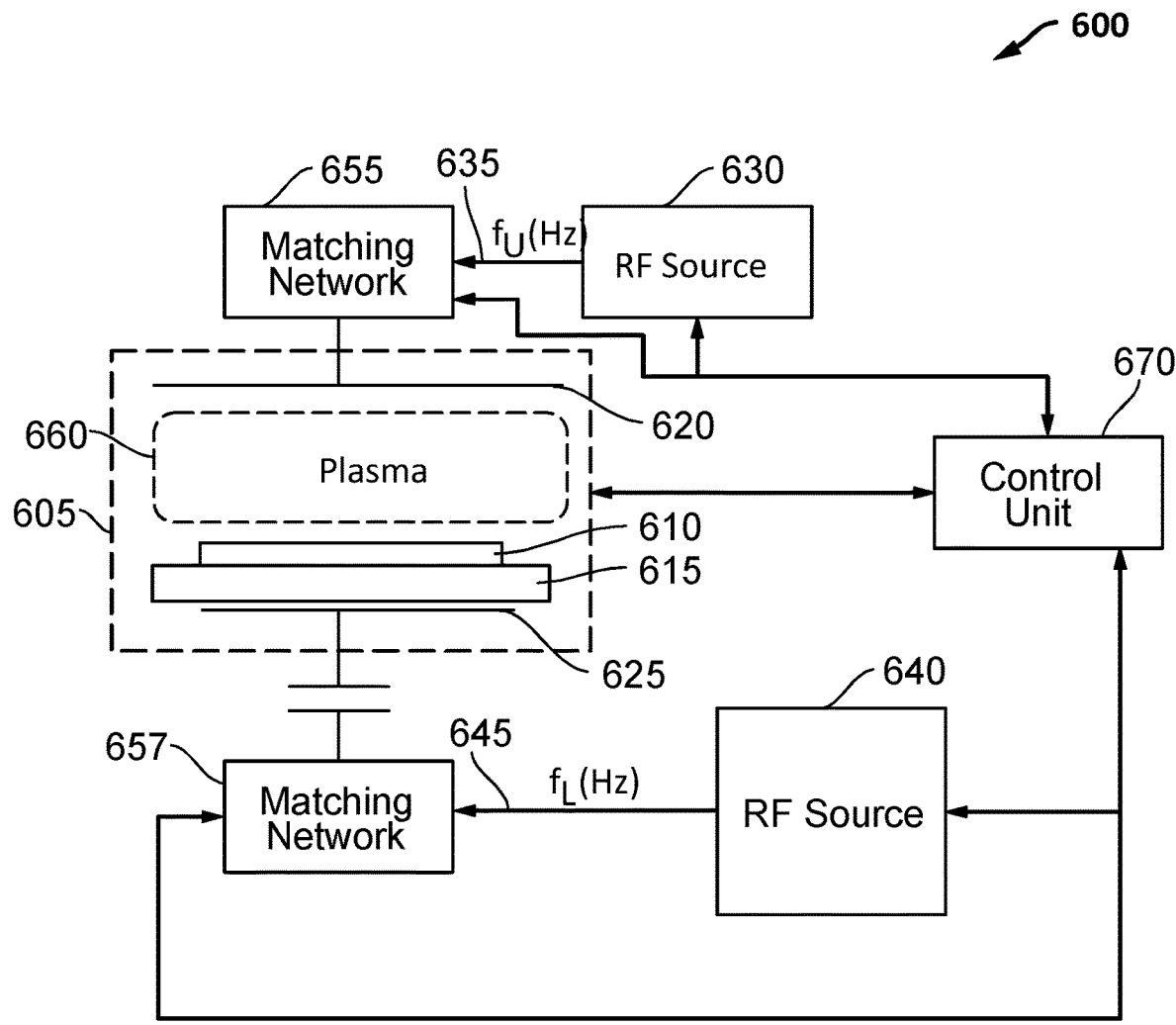
FIG. 6 is a block diagram illustrating one embodiment of a plasma processing system that may be used to transfer a pattern from a patterned organic layer to an underlying silicon-containing layer using the techniques described herein.

FIG. 6 provides one example embodiment for a plasma processing system 600 that can be used with respect to the disclosed techniques and is provided only for illustrative purposes. Although the plasma processing system 600 shown in FIG. 6 is a capacitively coupled plasma (CCP) processing apparatus, one skilled in the art would recognize the techniques described herein could be performed in inductively coupled plasma (ICP) processing apparatus, microwave plasma processing apparatus, Radial Line Slot Antenna (RLSATM) microwave plasma processing apparatus, electron cyclotron resonance (ECR) plasma processing apparatus, or other type of processing system or combination of systems. Thus, it will be recognized by those skilled in the art that the techniques described herein may be utilized with any of a wide variety of plasma processing systems.

The plasma processing system 600 can be used for a wide variety of operations including, but not limited to, etching, deposition, cleaning, plasma polymerization, plasma-enhanced chemical vapor deposition (PECVD), atomic layer deposition (ALD), atomic layer etch (ALE), and so forth. The structure of a plasma processing system 600 is well known, and the particular structure provided herein is merely of illustrative purposes. It will be recognized that different and/or additional plasma process systems may be implemented while still taking advantage of the techniques described herein.

Looking in more detail to FIG. 6, the plasma processing system 600 may include a process chamber 605. As is known in the art, process chamber 605 may be a pressure controlled chamber. A substrate 610 (in one example a semiconductor wafer) may be held on a stage or chuck 615. An upper electrode 620 and a lower electrode 625 may be provided as shown. The upper electrode 620 may be electrically coupled to a first radio frequency (RF) source 630 through a first matching network 655. The first RF source 630 may provide a source voltage 635 at an upper frequency ($f_U$). The lower electrode 625 may be electrically coupled to a second RF source 640 through a second matching network 657. The second RF source 640 may provide a bias voltage 645 at a lower frequency ($f_L$). Though not shown, it will be known by those skilled in the art that a voltage may also be applied to the chuck 615.

Components of the plasma processing system 600 can be connected to, and controlled by, a control unit 670 that in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. It will be recognized that control unit 670 may be coupled to various components of the plasma processing system 600 to receive inputs from and provide outputs to the components.

The control unit 670 can be implemented in a wide variety of manners. For example, the control unit 670 may be a computer. In another example, the control unit may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, FLASH memory, dynamic random access (DRAM) memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In operation, the plasma processing system 600 uses the upper and lower electrodes to generate a plasma 660 in the process chamber 605 when applying power to the system from the first RF source 630 and the second RF source 640. Further, as is known in the art, ions generated in the plasma 660 may be attracted to the substrate 610. The generated plasma can be used for processing a target substrate (such as substrate 610 or any material to be processed) in various types of treatments such as, but not limited to, plasma etching, deposition and/or sputtering.

In the CCP processing system shown in FIG. 6, application of power results in a high-frequency electric field being generated between the upper electrode 620 and the lower electrode 625. Processing gas delivered to process chamber 605 can then be dissociated and converted into a plasma. As shown in FIG. 6, the exemplary plasma processing system 600 described herein utilizes two RF sources. In an exemplary embodiment, the first RF source 630 provides source power at relatively high frequencies to convert the processing gas(es) delivered into the process chamber 605 into plasma and to control the plasma density. The second RF source 640 provides a bias power at lower frequencies to control ion bombardment energy.

In one example plasma processing system, for example, the first RF source 630 may provide about 0 to 1400 W of source power in a high-frequency (HF) range from about 3 MHz to 150 MHz (or above) to the upper electrode 620, and the second RF source 640 may provide about 0 to 1400 W of bias power in a low-frequency (LF) range from about 0.2 MHz to 60 MHz to the lower electrode 625. Different operational ranges can also be used depending on type of plasma processing system and the type of treatments (e.g., etching, deposition, sputtering, etc.) performed therein.

In one exemplary embodiment, the deposition step shown in FIG. 2B and. 3 may be performed with process conditions of 200 W to 1000 W source power, 0 W to 50 W bias power, 100 mT to 800 mT pressure, 0° C. to 50° C. electrostatic chuck temperature, and 100 standard cubic centimeters (SCCM) $C_4F_6$ gas flow. Other gases, such as for example, hydrocarbons, fluorocarbons and other $CH_xF_y$ chemistries (e.g., $CH_4$, $C_4F_8$, $C_4F_6$ and $CH_3F$, etc.) may alternatively be used or added to the gas flow.

In one exemplary embodiment, the etch step shown in FIGS. 2C and 3 may be performed with process conditions of 0 W to 100 W source power, 0 W to 50 W bias power, 2% to 20% bias power duty cycle, 10 mT to 50 mT pressure, 0° C. to 50° C. electrostatic chuck temperature, and 100 standard cubic centimeters (SCCM) $NF_3$ gas flow. Other ultra-lean gas chemistries, such as for example, $CF_4$ and/or $SF_6$ may alternatively be used or added to the $NF_3$ gas flow.

In one exemplary embodiment, the purge step shown in FIGS. 2D and 3 may be performed with process conditions of 0 W source power, 0 W bias power, 200 mT to 800 mT pressure, 0° C. to 50° C. electrostatic chuck temperature, and 500 standard cubic centimeters (SCCM) Ar gas flow. Other inert gases, such as for example, $N_2$ or He may alternatively be used or added to the Ar gas flow.

It is noted that the techniques described herein may be utilized within a wide range of plasma processing systems. Although a particular plasma processing system 600 is shown in FIG. 6, it will be recognized that the techniques described herein may be utilized within other plasma processing systems. In one example system, the RF sources shown in FIG. 6 may be switched (e.g., higher frequencies may be supplied to the lower electrode 625 and lower frequencies may be supplied to the upper electrode 620). Further, a dual source system is shown in FIG. 6 merely as an example system. It will be recognized that the techniques described herein may be utilized with other plasma processing systems in which a modulated RF power source is provided to one or more electrodes, direct current (DC) bias sources are utilized, or other system components are utilized.

It is noted that various deposition processes can be used to form one or more of the material layers shown and described herein. For example, one or more depositions can be implemented using chemical vapor deposition (CVD), plasma enhanced CVD (PECVD), physical vapor deposition (PVD), atomic layer deposition (ALD), and/or other deposition processes. In one example plasma deposition process, a gas mixture can be used including but not limited to hydrocarbons, fluorocarbons and other $CH_xF_y$ chemistries optionally in combination with one or more dilution gases (e.g., argon, nitrogen, etc.) at a variety of pressure, power, flow, and temperature conditions.

It is further noted that various etch processes can be used to etch one or more of the material layers shown and described herein. For example, one or more etch processes can be implemented using plasma etch processes, discharge etch processes, and/or other desired etch processes. In one example plasma etch process, a gas mixture can be used including but not limited to ultra-lean gas chemistries (e.g., $NF_3$, $CF_4$ and/or $SF_6$) optionally in combination with one or more dilution gases (e.g., argon, nitrogen, etc.) at a variety of pressure, power, flow and temperature conditions. As noted above, operational parameters (e.g., source power, bias power, bias duty cycle, chamber pressure and plasma species, etc.) may be controlled to segregate the deposition and etch processes described herein.

Other operating variables for process steps can also be adjusted to control the various deposition and/or etch processes described herein. The operating variables may include, for example, the chamber temperature, chamber pressure, flowrates of gases, types of gases, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for patterning a substrate, the method comprising:
   forming one or more underlying layers on the substrate, wherein the one or more underlying layers comprise a silicon-containing layer;
   forming a patterned organic layer over the silicon-containing layer;
   performing a cyclic dry process to remove exposed portions of the silicon-containing layer not covered by the patterned organic layer and transfer a pattern from the patterned organic layer to the silicon-containing layer, wherein the cyclic dry process includes a deposition step comprising a first source power level and an etch step, the etch step utilizing a pulsed plasma and comprising a second source power level less than the first source power level; and
   repeating the cyclic dry process.

2. The method of claim 1, wherein the cyclic dry process comprises:
   as part of the deposition step, depositing a polymer layer onto a surface of the substrate by exposing the substrate to a first plasma while the substrate is disposed within a processing chamber;
   as part of the etch step, etching the polymer layer and the exposed portions of the silicon-containing layer by exposing the substrate to a second plasma while the substrate is disposed within the processing chamber, wherein the second plasma utilizes the pulsed plasma;
   as part of a purge step, purging the processing chamber to remove byproducts of said etching from the processing chamber; and
   repeating the deposition, etch and purge steps a number of cycles and/or until the exposed portions of the silicon-containing layer are completely removed.

3. The method of claim 2, wherein the first plasma comprises a hydrocarbon gas chemistry, a fluorocarbon gas chemistry, or a $CH_xF_y$ gas chemistry.

4. The method of claim 2, wherein the deposition step is performed using process conditions which generate a radical-rich first plasma, which provides deposition of the polymer layer onto top and sidewalls surfaces of the patterned organic layer.

5. The method of claim 4, wherein the deposition of the polymer layer reduces or prevents lateral damage to the patterned organic layer during the etch step.

6. The method of claim 2, wherein the second plasma comprises $NF_3$, $CF_4$, or $SF_6$ gas chemistry.

7. The method of claim 2, wherein the etch step is performed using pulsed bias power to form the pulsed plasma.

8. The method of claim 2, wherein a short pulse of low bias power is used near the end of the etch step to control ion energy of ions in the second plasma and provide anisotropic etching of the exposed portions of the silicon-containing layer.

9. The method of claim 2, wherein the purge step is performed by supplying an inert gas to the processing chamber at high chamber pressure to provide rapid removal of etch byproducts.

10. The method of claim 2, wherein the processing chamber is not purged between the deposition step and the etch step.

11. The method of claim 1, wherein the second source power level is less than about 200 W.

12. A method for patterning a substrate, the method comprising:
    forming one or more underlying layers on the substrate, wherein the one or more underlying layers comprise a silicon-containing layer;
    forming a patterned organic layer over the silicon-containing layer;
    depositing a polymer layer onto a surface of the substrate by exposing the substrate to a first plasma while the substrate is disposed within a processing chamber;
    etching the polymer layer and exposed portions of the silicon-containing layer not covered by the patterned organic layer by exposing the substrate to a second plasma while the substrate is disposed within the processing chamber, wherein the second plasma includes the use of a pulsed bias power;
    purging the processing chamber after said etching by supplying an inert gas to the processing chamber to remove byproducts of said etching from the processing chamber; and
    repeating the depositing, etching and purging steps a number of cycles and/or until the exposed portions of the silicon-containing layer are completely removed.

13. The method of claim 12, wherein the first plasma comprises a hydrocarbon gas chemistry, fluorocarbon gas chemistry, or a CHxFy gas chemistry, and wherein the second plasma comprises $NF_3$, $CF_4$, or $SF_6$ gas chemistry.

14. The method of claim 12, wherein the depositing step is performed using process conditions that generate a radical-rich first plasma, which provides deposition of the polymer layer onto top and sidewall surfaces of the patterned organic layer.

15. The method of claim 14, wherein the deposition of the polymer layer reduces or prevents lateral damage to the patterned organic layer during the etching step.

16. The method of claim 12, wherein the pulsed bias power has a duty cycle of 20% or less.

17. The method of claim 12, wherein the pulsed bias power is used near the end of the etching step to control ion energy of ions in the second plasma and provide anisotropic etching of the exposed portions of the silicon-containing layer.

18. The method of claim 12, wherein the purging step is performed by supplying the inert gas to the processing chamber at high chamber pressure to provide rapid removal of etch byproducts.

19. The method of claim 12, wherein the processing chamber is not purged between the depositing step and the etching step.

20. A method for patterning a substrate, the method comprising:
- forming one or more underlying layers on the substrate, wherein the one or more underlying layers comprise a silicon-containing layer;
- forming a patterned organic layer over the silicon-containing layer;
- performing a cyclic dry process to remove exposed portions of the silicon-containing layer not covered by the patterned organic layer and transfer a pattern from the patterned organic layer to the silicon-containing layer, wherein the cyclic dry process includes a deposition step and an etch step, the etch step utilizing a pulsed plasma and comprising no bias power during the first half of the etch step; and
- repeating the cyclic dry process.

* * * * *